(12) United States Patent
Cheng et al.

(10) Patent No.: US 10,879,866 B2
(45) Date of Patent: Dec. 29, 2020

(54) FILTER CIRCUIT, HEATING CIRCUIT, AND SEMICONDUCTOR PROCESSING APPARATUS

(71) Applicant: BEIJING NAURA MICROELECTRONICS EQUIPMENT CO., LTD., Beijing (CN)

(72) Inventors: Xiaoyang Cheng, Beijing (CN); Gang Wei, Beijing (CN); Haitao Yu, Beijing (CN)

(73) Assignee: BEIJING NAURA MICROELECTRONICS EQUIPMENT CO., LTD., Beijing (CN)

(*) Notice: Subject to any disclaimer, the term of this patent is extended or adjusted under 35 U.S.C. 154(b) by 11 days.

(21) Appl. No.: 16/386,967

(22) Filed: Apr. 17, 2019

(65) Prior Publication Data
US 2019/0245505 A1 Aug. 8, 2019

Related U.S. Application Data

(63) Continuation of application No. PCT/CN2017/088365, filed on Jun. 15, 2017.

(30) Foreign Application Priority Data

Nov. 7, 2016 (CN) .......................... 2016 1 0976263

(51) Int. Cl.
*H03H 7/09* (2006.01)
*H01L 21/67* (2006.01)
(Continued)

(52) U.S. Cl.
CPC ......... *H03H 7/09* (2013.01); *H01L 21/67098* (2013.01); *H01L 21/6833* (2013.01);
(Continued)

(58) Field of Classification Search
CPC .. H03H 7/09; H03H 1/0007; H01L 21/67098; H01L 21/6833; H02J 3/01; H02M 3/335; H02M 7/5387; H05B 6/02; H05B 6/36
(Continued)

(56) References Cited

U.S. PATENT DOCUMENTS

| 4,422,056 A | 12/1983 | Roberts et al. |
| 5,783,984 A | 7/1998 | Keuneke |

(Continued)

FOREIGN PATENT DOCUMENTS

| CN | 1545200 A | 11/2004 |
| CN | 201805362 U | 4/2011 |

(Continued)

OTHER PUBLICATIONS

"Measuring Leakage Inductance" by Voltech Instruments © 2001 (Year: 2001).*

(Continued)

*Primary Examiner* — Benny T Lee
*Assistant Examiner* — Hafizur Rahman
(74) *Attorney, Agent, or Firm* — Anova Law Group, PLLC

(57) ABSTRACT

A filter circuit is connected between a heating source and a load for filtering the load, and includes an inductor branch and a capacitor branch connected in parallel. The inductor branch includes a one-piece structured integrated component, and the integrated component is configured with a transformer function member and an inductor function member. The inductor function member is connected in series between the heating source and the transformer function member for filtering the load. The transformer function member is connected in parallel with the load for transmitting a heating electric signal output by the heating source to the load.

18 Claims, 2 Drawing Sheets

(51) Int. Cl.

| | | |
|---|---|---|
| *H05B 6/36* | (2006.01) | |
| *H01L 21/683* | (2006.01) | |
| *H02J 3/01* | (2006.01) | |
| *H02M 3/335* | (2006.01) | |
| *H03H 1/00* | (2006.01) | |
| *H02M 7/5387* | (2007.01) | |
| *H05B 6/02* | (2006.01) | |

(52) U.S. Cl.
CPC ............... *H02J 3/01* (2013.01); *H02M 3/335* (2013.01); *H02M 7/5387* (2013.01); *H03H 1/0007* (2013.01); *H05B 6/02* (2013.01); *H05B 6/36* (2013.01)

(58) Field of Classification Search
USPC .......................................................... 333/177
See application file for complete search history.

(56) References Cited

U.S. PATENT DOCUMENTS

| | | | |
|---|---|---|---|
| 6,768,656 B2 | 7/2004 | Figueroa | |
| 7,209,024 B2 | 4/2007 | Nakahori | |
| 8,465,483 B2* | 6/2013 | Lario Garcia | ..... A61B 18/1206 606/34 |
| 8,637,794 B2* | 1/2014 | Singh | .................... C23C 14/541 219/483 |
| 8,755,204 B2* | 6/2014 | Benjamin | ............... H02M 7/44 363/37 |
| 2016/0020745 A1 | 1/2016 | Joo et al. | |

FOREIGN PATENT DOCUMENTS

| | | |
|---|---|---|
| CN | 103813589 A | 5/2014 |
| CN | 104218912 A | 12/2014 |
| JP | 2015041959 A | 3/2015 |
| WO | 2015131359 A1 | 9/2015 |

OTHER PUBLICATIONS

"Ceramic Capacitors Aid High-Voltage Designs", published in May 1, 2004 in Power Electronics Magazine (Year: 2004).*
Technical note of TDK "Guide to Replacing an Electrolytic Capacitor with an MLCC", TDK corporation © 2020 (Year: 2020).*
"Deep Heat" by Klein in Medscape, published on Sep. 3, 2019 (Year: 2019).*
The World Intellectual Property Organization (WIPO) International Search Report for PCT/CN2017/088365 dated Aug. 30, 2017 6 Pages.

* cited by examiner

FILTER CIRCUIT, HEATING CIRCUIT, AND SEMICONDUCTOR PROCESSING APPARATUS

CROSS-REFERENCE TO RELATED APPLICATION

This application is a continuation application of International Application No. PCT/CN2017/088365, filed on Jun. 15, 2017, which claims priority to Chinese Patent Application No. 201610976263.5, filed on Nov. 7, 2016. The above enumerated patent applications are incorporated herein by reference.

TECHNICAL FIELD

The present disclosure relates to the field of semiconductor device fabrication technology, and in particular, to a filter circuit, a heating circuit, and a semiconductor processing apparatus.

BACKGROUND

In semiconductor devices, plasma processing apparatuses for silicon etching processes typically employ an inductively coupled plasma (ICP) principle in which radio frequency (RF) energy from a RF power source is fed into a chamber to ionize a special gas (such as argon (Ar), helium (He), nitrogen ($N_2$), etc.) under high vacuum conditions, to generate a plasma containing a large amount of active particles (electrons, ions, excited atoms and molecules, radicals, etc.). These active particles interact with a wafer that is placed in the chamber and exposed to the plasma environment to cause various physical and chemical reactions on the surface of the wafer material, thereby changing the surface properties of the wafer material and completing the etching process for the wafer.

In the etching process of a large-sized wafer, one of significant technical indicators is process uniformity. Factors that determines process uniformity include uniformity of multiple physical fields such as electric field, magnetic field, temperature, airflow field in the chamber, etc., where the temperature is a very critical factor. For example, in an etching process for less than 90 nm, the existing electrostatic chuck usually has a single temperature zone, that is, there is one zone for heating the wafer, which makes it impossible to compensate for the temperature difference on different regions of the wafer, thereby failing to achieve the effect of temperature on process uniformity. With the development of smaller line-width processes, a dual-temperature-zone electrostatic chuck or even a multiple-temperature-zone electrostatic chuck have become a key technology for silicon etching apparatus. For example, the current 28-65 nm silicon etching process requires the dual-temperature-zone electrostatic chuck.

SUMMARY

The present disclosure provides a filter circuit, a heating circuit, and a semiconductor processing apparatus. The filter circuit can not only reduce the volume of the filter circuit, save space, and realize the miniaturization of the filter circuit, but also reduce the number of components in the filter circuit and reduce the device cost of the filter circuit.

The present disclosure provides a filter circuit connected between a heating source and a load for filtering the load. The filter circuit includes an inductor branch and a capacitor branch connected in parallel, where the inductor branch includes a one-piece structured integrated component. The integrated component is configured with a transformer function member and an inductor function member, where the inductor function member is connected in series between the heat source and the pressure transformer function member for performing filtering for the load. The voltage transformation function is connected in parallel with the load for transmitting a heating electrical signal output by the heating source to the load.

In some embodiments, the transformer function member includes a first magnetic core in a closed loop, and the first magnetic core includes a first side and a second side opposite to each other, where a primary coil is wound on the first side, and a secondary coil is wound on the second side; and two terminals of the secondary coil are respectively connected to the positive and negative poles of the load. The inductor function member includes two second magnetic cores, which are respectively connected to terminals of the first side and form a non-closed open ring with the first side. Inductive coils are wound on the two secondary coils, and one terminal of each of the two inductive coils on the two second magnetic cores is respectively connected to two ends of the primary coil. Another terminal of each of the two inductive coils on the two second magnetic cores is respectively connected to the positive and negative terminals of the heating source.

In some embodiments, the second magnetic cores have columnar shapes; the two second magnetic cores are parallel to each other, and one terminal of each of the two magnetic cores is respectively connected to a terminal of the first side.

In some embodiments, the first magnetic core and the second magnetic core are fabricated by using a ferromagnetic material, and an application frequency of the ferromagnetic material ranges from 400 kHz to 100 MHz.

In some embodiments, the ferromagnetic material includes a nickel-zinc ferromagnetic material, and a relative magnetic permeability of the nickel-zinc ferromagnetic material ranges from 100 to 400, and a Curie temperature of the nickel-zinc ferromagnetic material ranges from 350-450° C., and an application frequency of the nickel-zinc ferromagnetic material ranges less than 20 MHz.

In some embodiments, a number of turns of the primary coil is greater than or equal to a number of turns of the secondary coil.

In some embodiments, an inductance value of the inductor function member ranges from 40 μH to 100 μH.

In some embodiments, numbers of turns of the inductive coils on the two second magnetic cores are equal, and the inductance values of the inductive coils on the two second magnetic cores are equal.

In some embodiments, the capacitor branch includes at least two branches, and the inductor function member in each of the inductor branches is connected in parallel with at least one of the capacitor branches.

In some embodiments, the capacitor branch includes a capacitor, and the capacitor uses a ceramic capacitor.

As another technical solution, the present disclosure further provides a heating circuit for heating a chuck that carries the workpiece to be processed, and separately controlling temperatures of different temperature zones of the chuck. The heating circuit includes a heating source and a load, where the heating source is configured to supply electric energy for heating the load, the number of the load is consistent with the number of temperature zones of the chuck, and is set in one-to-one correspondence. The heating circuit further includes the filtering circuit provided by the present disclosure. An input terminal of the filter circuit is connected to the heating source, and an output terminal of the filter circuit is connected to the load for filtering the load.

As another technical solution, the present disclosure also provides a semiconductor processing apparatus including a chuck for carrying a workpiece to be processed, and a heating circuit for controlling temperatures of different temperature zones of the chuck, the heating circuit adopting the above heating circuit provided by the present disclosure.

The disclosure has the following beneficial effects.

The filter circuit provided by the present disclosure has a one-piece structured integrated component, and the integrated component is configured with a transformer function member and an inductor function member. The inductor function member is connected in series between the heat source and the transformer function member to filter the load. The transformer function member is connected in parallel with the load to transmit the heating electric signal output by the heating source to the load. The above-mentioned inductor branch adopts the above-mentioned integrated component, and the integrated component adopts an integrated structure integrating a transformation function and an inductance function, so as to reduce the number of components in the filter circuit, thereby not only reducing the volume of the filter circuit, but also saving space. Moreover, the device cost of the filter circuit can also be reduced. At the same time, since one load only corresponds to one inductor branch, compared with the two inductor branches corresponding to one load in the existing, the volume of the inductor branch can be greatly reduced under the same inductance performance requirement. Therefore, the volume of the filter circuit can be further reduced, and the need for miniaturization of the filter circuit can be realized.

The heating circuit provided by the disclosure employs the forgoing filter circuit provided by the present disclosure, to reduce the volume of the filter circuit, save space, realize the miniaturization of the filter circuit, reduce the number of components in the filter circuit, and reduce the device cost of the filter circuit.

The semiconductor processing apparatus provided by the disclosure employs the forgoing heating circuit provided by the present disclosure, to reduce the volume of the filter circuit, save space, realize the miniaturization of the filter circuit, reduce the number of components in the filter circuit, and reduce the device cost of the filter circuit.

REFERENCE NUMERALS FOR MAIN COMPONENTS

Figure 1:
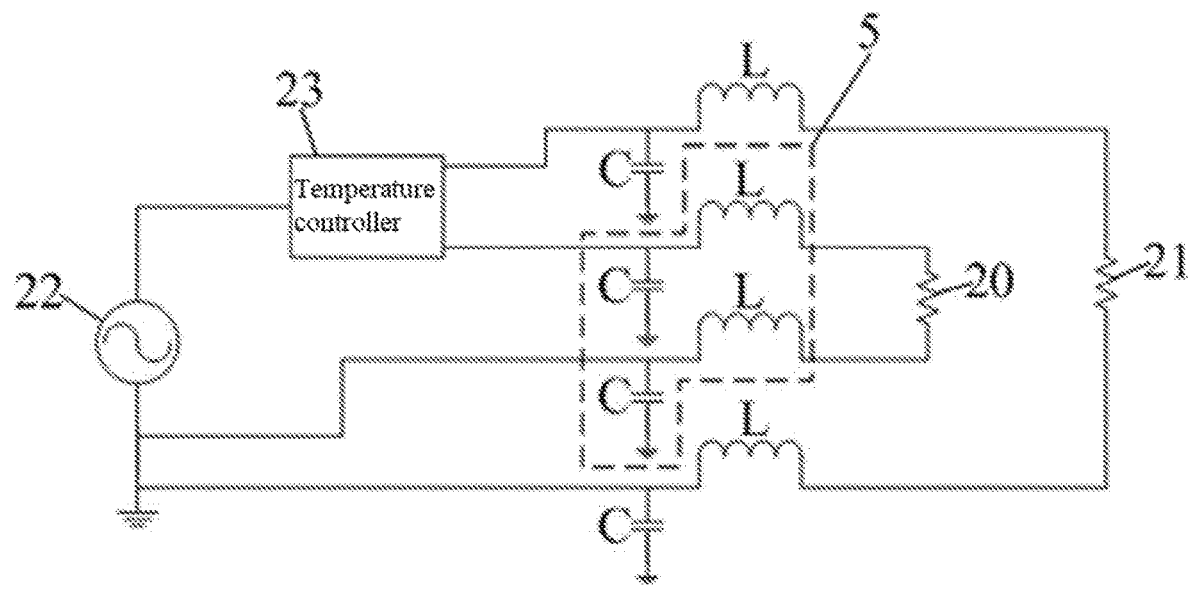
FIG. 1 is a schematic circuit diagram of a heating circuit of a dual-temperature-zone electrostatic chuck in a prior art.

The reference numerals are as follows:
1—heating source; 11—heating power source; 12—temperature control circuit; 2—load; 3—inductor branch; 4—capacitor branch; 5—filter circuit; 31—transformer function member; 311—primary coil; 312—secondary coil; 32—inductor function member; 300—first magnetic core; 301—first side; 302—second side; 321—second magnetic core; T1—primary coil; T2—secondary coil; T3—inductive coil; C—capacitor; 20—inner-ring-heater; 21—outer-ring-heater; 22—AC power source; 23—temperature controller; L. inductor.

DETAILED DESCRIPTION

In order to enable those skilled in the art to better understand the technical solutions of the present disclosure, a filter circuit, a heating circuit and a semiconductor processing apparatus provided by the present disclosure are further described in detail below with reference to the accompanying drawings and specific embodiments.

FIG. 1 is a schematic diagram of a heating circuit of a dual-temperature-zone electrostatic chuck. As shown in FIG. 1, the dual-temperature-zone electrostatic chuck includes a heating layer for heating a wafer, an alternating current (AC) power source 22, and a temperature controller 23, where an inner-ring heater 20 and an outer-ring heater 21 are disposed in the heating layer to respectively heat a central region and an edge region of the wafer to a temperature required for the process. The temperature controller 23 is for controlling an output power of the inner-ring-heater 20 and the outer-ring-heater 21, respectively. The AC power source 22 is configured to provide electrical energy. Under an influence of a high-frequency signal output by the downward RF power source electrically connected to the electrostatic chuck, a high-frequency signal is present at the heating layer terminal. Therefore, it is usually necessary to provide a filter circuit 5 in the heating circuit for performing filtering the high-frequency signal on the heating layer terminal, to prevent high frequency signals from being transmitted to the temperature controller 23 and the AC power source 22 through the heating circuit, causing damages to the device.

Referring to FIG. 1 again, the filter circuit 5 includes four inductor branches, each of which is connected in parallel with a capacitor branch. Each inductor branch is connected in series between a load (the inner-ring-heater 20 or the outer-ring-heater 21) and the AC power source 22. The AC signal output by the AC power source 22 reaches the heating layer through the filter circuit 5. The filter circuit 5 forms a low-pass filter circuit by passive components such as an inductor L, a capacitor C, etc.

In practical applications, the filter circuit 5 described above inevitably has the following problems.

First, two inductors are required to be provided in corresponding inductor branch for each load, and the two inductors are respectively connected in series with the two terminals of the load to avoid any high-frequency interference signal transmitted through either terminal of the load to the AC power source 22, which results in a large number of components included in the filter circuit 5, thereby not only increasing the volume of the filter circuit, but also increasing the device cost of the filter circuit.

Second, two inductor branches and two capacitor branches are required to be configured for each load. For example, if the electrostatic chuck has four temperature zones, the filter circuit needs to be configured with eight inductor branches and eight capacitor branches, which further increase the volume of the filter circuit, and increase the number of components and the device cost in the filter circuit 5.

With respect to the above technical problems existing in the existing technology, the present disclosure provides a filter circuit, a heating circuit, and a semiconductor processing apparatus.

Figure 2:
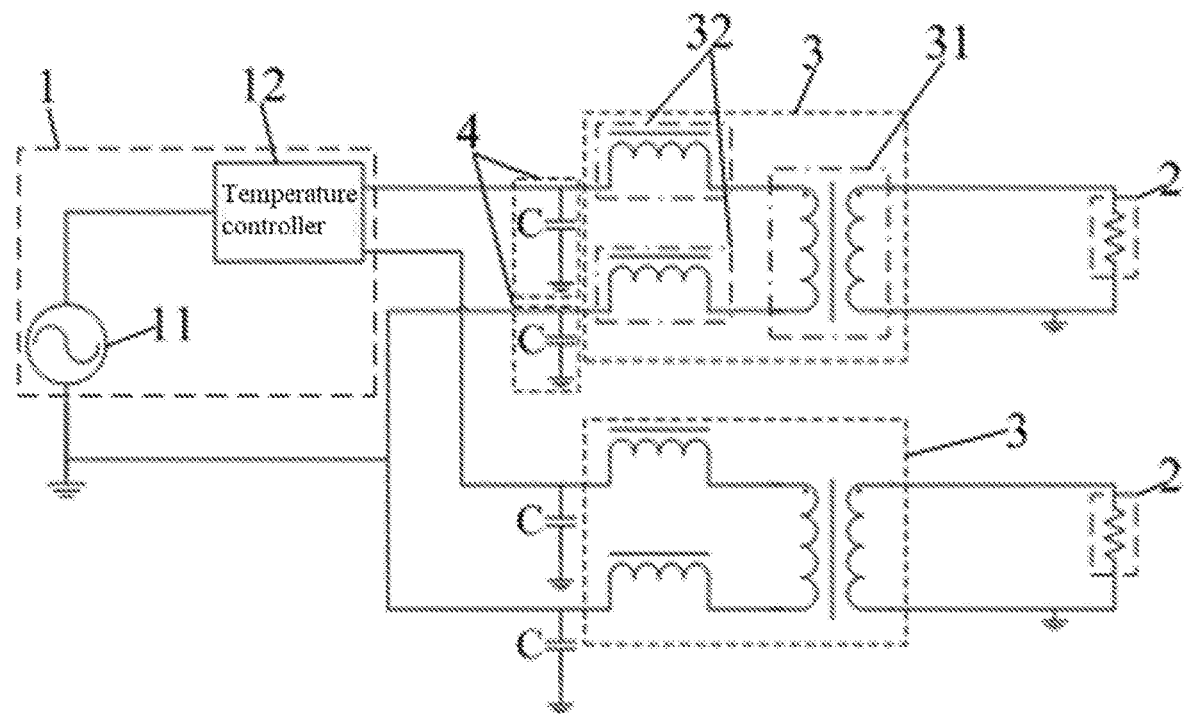
FIG. 2 is a schematic circuit diagram of a filter circuit according to some embodiments of the present disclosure.
Figure 3:
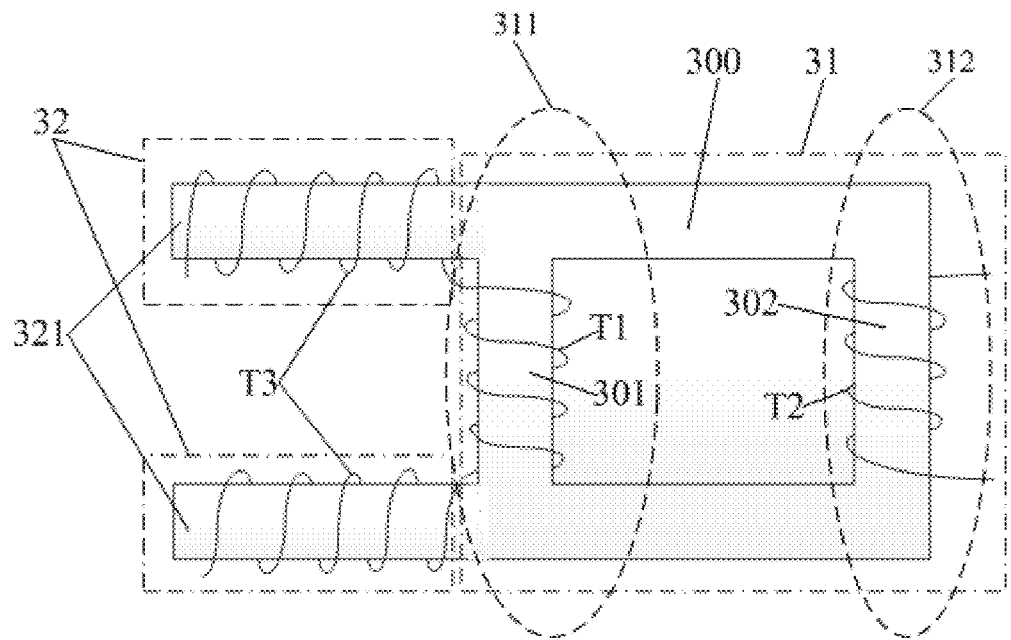
FIG. 3 is a schematic structural diagram of the inductor branch of FIG. 2.

FIG. 2 is a schematic circuit diagram of a filter circuit according to some embodiments of the present disclosure. FIG. 3 is a schematic structural diagram of the inductor branch of FIG. 2. As shown in FIG. 2 and FIG. 3, the filter circuit provided by the present disclosure is connected between the heating source 1 and the load 2 for filtering the load 2. In some embodiments, there are may be one or more loads. The filter circuit includes an inductor branch and a capacitor branch 4 connected in parallel. The inductor branch includes a one-piece structured integrated structure 3, the integrated component 3 is configured with a transformer function member 31 and an inductor function member 32. The inductor function member 32 corresponds to an inductive element, which is connected in series with the heating source 1 and the transformer function members 31, and configured to filter the load 2. The transformer function member 31 corresponds to a transformer element that is connected in parallel with the load 2 and configured to transmit the heating electric signal output by the heat source 1 to the load 2.

In some embodiments, the heating source 1 includes a heating power source 11 and a temperature control circuit 12, where the heating power source 11 is configured to supply a heating electric signal to the load 2 and the temperature control circuit 12 is configured to control the temperature of the load 2. During the semiconductor processing process, the chuck (such as an electrostatic chuck) for carrying the workpiece to be processed is usually electrically connected to the downward RF power source, and the downward RF power source is used to load the RF voltage to the chuck, which causes the load 2 to generate a high frequency. The frequency of the high frequency signal is less than or equal to the radio frequency of the downward RF power source, which may cause high frequency signal interference or damage to the heating source 1. For this reason, the high-frequency signal generated at the end of the load 2 can be filtered by the inductor function member 32, so that the high-frequency signal does not cause interference and damage to the heating source 1. At the same time, by means of the transformer function member 31, the heating electric signal output by the heating source 1 can be transmitted to the load 2, so as to heat the load 2.

By adopting the above-mentioned integrated component 3, the integrated component 3 adopts a one-piece structure integrating the functions of the transformer element and the inductance element, thereby reducing the number of components in the filter circuit, which can not only reduce the volume of the filter circuit, and save space, but also reduce the device cost of the filter circuit. In addition, one load 2 only corresponding to one inductor branch (i.e., one integrated component), compared with the two inductor branches corresponding to one load in the existing technology, in the case of achieving the same inductance performance requirement, can reduce the volume of the inductor branch, thereby further reducing the volume of the filter circuit and satisfying the requirement of the miniaturization of the filter circuit.

In some embodiments, as shown in FIG. 3, the integrated structure employed in the integrated component 3 has an "R" shape, and the integrated component 3 is configured with a transformer function member 31 serving as a transformer element and an inductor function member 32 serving as an inductor element. The transforming function member 31 includes a first magnetic core 300, and the first magnetic core 300 has a closed loop shape, for example, a quadrangular ring shape. Moreover, the first magnetic core 300 includes a first side 301 and a second side 302 disposed opposite to each other. A primary coil 311 (including a multi-turn windings T1) is wound on the first side 301, and a secondary coil 312 (including a multi-turn winding T2) is wound on the second side 302. Both terminals of the secondary coils 312 are respectively connected to the positive terminal and the negative terminal of the load 2. The primary coil 311 and the secondary coil 312 use a magnetic coupling method to transmit the heating electric signal to the load 2. This coupling method can reduce the contact point of the circuit, which improves the heat generation problem caused by the contact impedance and reduces the energy loss.

The inductor function member 32 includes two second magnetic cores 321 respectively connected to the terminals of the first side 301 and forming a non-closed open loop with the first side edges 301. The two second secondary magnetic core 321 are respectively wound with inductive coils T3. One terminal of each of the inductive coils T3 on the two second magnetic cores 321 is respectively connected to both terminals of the primary coil 311, and another terminal of each of the inductive coils T3 on the two second magnetic cores 321 is respectively connected to the positive and negative terminals of the heating source 1.

In some embodiments, the second magnetic core 321 has a columnar shape, and the two second magnetic cores 321 are parallel to each other, and one terminal of the second magnetic cores 321 are respectively connected to the terminals of the first side 301. As such, the overall structure of the above integrated components is more compact, thereby greatly reducing the volume of the inductor branch, and saving the space occupied by the entire filter circuit.

Taking the filter circuit of a dual-temperature-zone electrostatic chuck in as an example, in the existing technology, the inductor branch in the filter circuit uses a conventional inductor, and each conventional inductor has a diameter of 35 mm, a length of 140 mm, and a winding diameter of 1.5 mm; and the capacitor branch in the filter circuit uses standard high-voltage ceramic capacitors, which are 15 mm long, 10 mm wide and 3 mm high. Four filter branches consisting of a traditional inductor and a capacitor are required to be configured in the filter circuit, and four filter branches form a total filter circuit box, where the size of the filter circuit box is: 420*210*105 (length*width*height) mm.

In contrast, in some embodiments of the present disclosure, the integrated component 3 has a one-piece structure and has an "R" shape. In the "R"-shaped structure, the outer ring edge of the first magnetic core 300 of the closed loop has a length of 48 mm, a width of 32 mm, and a height of 8 mm; and the inner core 300 has an inner ring length of 16 mm, a width of 16 mm, a height of 8 mm, and a winding diameter of 1.5 mm. In the embodiment, the filter circuit needs to be configured with two filter branches composed of the "R"-shaped integrated component 3, and the two filter branches form a total filter circuit box.

By comparison, in the case where the volume of the capacitor branch in this embodiment is the same as the volume of the capacitor branch in the existing technology, the size of the filter circuit box in this embodiment is 64*48*24 (length*width*height) mm, which is much smaller than the size of the filter circuit box in the existing technology. Meanwhile, the filter circuit in this embodiment requires only two "R"-shaped integrated components 3 and uses fewer components than the number (four) of the conventional inductors used in the filter circuit in the existing technology. Therefore, in the case where the number of capacitors in the embodiment is the same as the number of capacitors in the existing technology, the number of components used in the filter circuit and the number of filter branches in the embodiment are both reduced by half, thereby not only significantly reducing the volume of the filter circuit and saving the space occupied by the entire filter circuit, but also reducing the cost of the device.

In some embodiments, the first magnetic core 300 and the second magnetic core 321 are prepared by using a ferromagnetic material, and the application frequency of the ferromagnetic material ranges from 400 kHz to 100 MHz. Since the magnetic core of the ferromagnetic material does not reach saturation in the frequency range, the magnetic flux of the magnetic core can vary normally in the frequency range, and the frequency of the high-frequency signal generated at the terminals of the load is substantially within the application frequency range. Therefore, the second magnetic core 321 using the ferromagnetic material serves as the inductor function member 32 can well filter out the high frequency signal. In addition, the ferromagnetic material has a wide application frequency range, and the inductor function member 32 using the magnetic core material can substantially filter high frequency signals of various frequencies that may be generated in the semiconductor processing process.

Further in some embodiments, the ferromagnetic material is a nickel-zinc ferromagnetic material, the relative magnetic permeability of the nickel-zinc ferromagnetic material ranges from 100 to 400, and the Curie temperature of the nickel-zinc ferromagnetic material ranges from 350 to 450° C., and the application frequency ranges from less than 20 MHz. The inductor function member 32 using the magnetic core material can well filter the high frequency signal (such as the signal of 13.56 MHz) at the terminals of the load 2, thereby avoiding interference of the high frequency signal on the heating source 1. The inductance value of the inductor function member 32 using the magnetic core material does not have a large fluctuation with temperature, thereby making the filtering performance of the entire filter circuit more stable.

In some embodiments, the number of turns of the primary coil 311 (i.e., the number of windings T1) is greater than or equal to the number of turns of the secondary coil 312 (i.e., the number of windings T2). For example, the ratio of the number of turns of the primary coil 311 to the number of turns of the secondary coil 312 is 1:1, 2:1, 3:1, or 10:1 etc. As such the load 2 can obtain a larger heating current, which facilitates the load 2 to the rapidly heat the corresponding temperature zone of the electrostatic chuck.

In some embodiments, the inductance value of the inductor function member 32 ranges from 40 µH to 100 µH. The actual inductance value of the inductor function member 32 is related to the frequency of the high frequency signal to be filtered. The inductor function member 32 with the inductance value in this range can well filter high frequency signals of various frequencies that may be generated in the semiconductor processing process. The frequencies of high frequency signals that may be generated in the semiconductor processing process are, for example, 13.56 MHz, 400 KHz, 2 MHz, 27.12 MHz, 40 MHz, 60 MHz, 100 MHz, etc.

It should be noted that the inductance value of the inductor function member 32 for filtering at the time of design can be calculated and determined according to the following Equation (1):

$$L(\mu H) = \frac{10\pi r^2 \mu_0 \mu_r N^2}{9r + 10l};$$ Equation (1)

where r is the radius of the inductive coil T3, l is the length of the inductive coil T3, N is the number of turns of the inductive coil T3, $u_0$ is the vacuum permeability constant, and $u_r$ is the relative permeability of the second magnetic core 321.

By adjusting the radius, the length and the number of turns of the inductor T3, the magnitude of the inductance value of the inductor function member 32 for filtering can be adjusted, thereby reducing the number of the inductor function members 32, thereby reducing the inductor branches and even the entire volume of the filter circuit.

In some embodiments, the numbers of turns of the inductor T3 on the two second magnetic cores 321 are equal, and the inductance values of the inductors T3 on the two second magnetic cores 321 are equal. Of course, in practical applications, the inductance values of the inductor T3 on the two second magnetic cores 321 may not be equal, as long as the filter circuit can filter the high frequency signal generated at the terminal of the load 2.

In some embodiments, there are at least two capacitor branches 4, and the inductor function member 32 in each of the inductor branches is connected in parallel with the at least one capacitor branch 4. In some embodiments, there are two capacitor branches 4 in the embodiment, and the inductor function member 32 in each of the inductor branches is connected in parallel with a capacitor branch 4. The capacitor branch 4 includes a capacitor C, and the capacitor C employs a ceramic capacitor. Ceramic capacitors have a high withstand voltage range (e.g., the withstand voltages greater than 1 kV), which satisfies the performance requirements of filter capacitors in the filter circuit. The capacitance value of the capacitor C can be determined according to the frequency of the high frequency signal to be filtered out.

It should be noted that, in practical applications, the capacitor branch 4 may also include a resistor, and the resistor is connected in series with the capacitor C for filtering the high frequency signal. The resistance value of the resistor is also determined based on the frequency of the high frequency signal to be filtered out.

In summary, when the inductance performance requirement is met, the filter circuit provided by the embodiment of the present disclosure can not only greatly reduce the volume of the inductor branch, thereby saving the space occupied by the entire filter circuit and satisfying the requirement of miniaturizing the filter circuit, but also can reduce the volume of the filter circuit, save space, reduce the number of components in the filter circuit, and reduce the device cost of the filter circuit.

Figure 4:
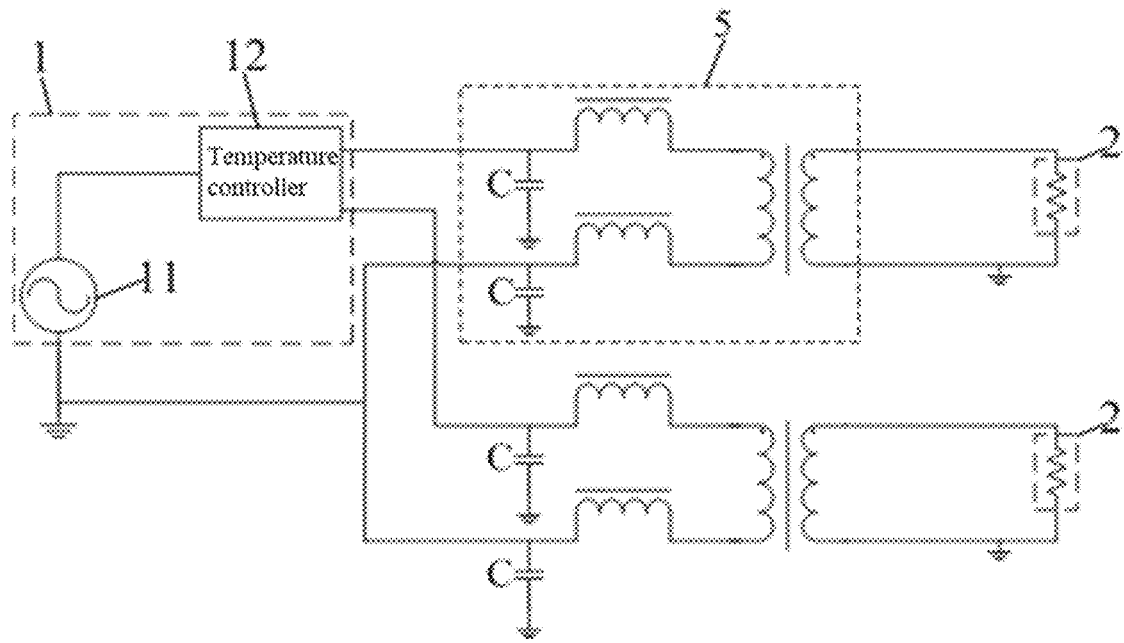
FIG. 4 is a schematic circuit diagram of a heating circuit in some embodiments of the present disclosure.

As shown in FIG. 4, an embodiment of the present disclosure provides a heating circuit for heating different temperature zones of a chuck (such as an electrostatic chuck, for carrying a workpiece to be processed), and separately controlling temperatures of different temperature zones of the chuck. The heating circuit includes a heating source 1, a load 2 and a filter circuit, where the heating source 1 is configured to supply a heating power to the load 2. The heating source 1 includes a heating power source 11 and a temperature control circuit 12, where the heating power source 11 is configured to provide a heating electrical signal to the load 2, and the temperature control circuit 12 is configured to control the temperature of the load 2. In some embodiments, there may be one or more loads 2. A number of the loads 2 and a number of the temperature zones of the chuck are arranged in a one-to-one correspondence. That is, each temperature zone of the chuck is correspondingly provided with a load 2.

The heating power source 11 and the temperature control circuit 12 may malfunction resulting from being easily interfered by the high-frequency signal at the terminals of the load 2. The high-frequency signal can be filtered by setting the filter circuit. The filter circuit adopts the filter circuit 5 provided by the above embodiment of the present disclosure. The input terminal of the filter circuit 5 is connected to the heating source 1, and the output terminal is connected to the load 2 for filtering the load 2. Moreover, there are a plurality of filter circuits 5, and a number of the filter circuits corresponds to a number of the loads 2. Each of the filter circuits 5 is respective connected to each of the loads 2 in a one-to-one correspondence. In this embodiment, two temperature zones are disposed on the chuck, and correspondingly, as shown in FIG. 4, there are two loads 2, and two filter circuits 5, and the two filter circuits 5 are respectively configured to filter the two loads 2.

By adopting the above-mentioned filter circuit 5, the heating circuit provided by the embodiment of the disclosure can not only reduce the volume of the filter circuit, save space, and satisfy the requirement of miniaturization of the filter circuit, but also reduce the number of components in the filter circuit and reduce the device cost of filter circuit.

Embodiments of the present disclosure provide a semiconductor processing apparatus including a chuck for carrying a workpiece to be processed, and a heating circuit for controlling temperatures of different temperature zones of the chuck. The heating circuit adopts the heating circuit provided by the embodiment of the present disclosure.

By adopting the heating circuit provided by the embodiment of the disclosure, the disclosure can not only reduce the volume of the filter circuit, save space, and satisfy the requirement of miniaturization of the filter circuit, but also reduce the number of components in the filter circuit and reduce the device cost of the filter circuit.

It is to be understood that the above embodiments are merely exemplary embodiments employed to explain the principles of the disclosure, but the disclosure is not limited thereto. Various modifications and improvements can be made by those skilled in the art without departing from the spirit and scope of the disclosure, and such modifications and improvements are also considered to be within the scope of the disclosure.

What is claimed is:

1. A filter circuit connected between a heating source and at least one load, and configured to filter the at least one load, wherein the filter circuit comprises:
   an inductor branch including a one-piece structured integrated component configured with a transformer function member and an inductor function member, wherein:
   the inductor function member is connected in series between the heating source and the transformer function member and configured to filter the at least one load, and
   the transformer function member is connected in parallel with the at least one load and configured to transmit a heating electrical signal output by the heating source to the at least one load; and
   at least two capacitor branches, wherein at least one of the at least two capacitor branches are in a shunt connection with the inductor function member in the inductor branch.

2. The filter circuit according to claim 1, wherein:
   the transformer function member includes a first magnetic core in a closed loop, the first magnetic core including a first side and a second side disposed opposite to each other, wherein a primary coil is wound on the first side, a secondary coil is wound on the second side; and two terminals of the secondary coil are respectively coupled to a positive terminal and a negative terminal of the at least one load; and
   the inductor function member includes two second magnetic cores respectively connected to terminals of the first side and forming a non-closed open loop with the first side; and inductive coils are respectively wound on the two second magnetic cores, and one terminal of each of the inductive coils on the two second magnetic core is respectively connected to two terminals of the primary coil, and another terminal of each of the inductive coils on the two second magnetic cores is respectively connected to the positive and negative terminals of the heating source.

3. The filter circuit according to claim 2, wherein:
   each of the two second magnetic cores is of a columnar shape;
   the two second magnetic cores are parallel to each other; and
   one terminal of each of the two second magnetic cores is respectively connected to the terminals of the first side.

4. The filter circuit according to claim 2, wherein:
   the first magnetic core and the second magnetic core are fabricated using a ferromagnetic material; and
   an application frequency of the ferromagnetic material ranges from 400 KHz-100 MHz.

5. The filter circuit according to claim 4, wherein:
   the ferromagnetic material includes a nickel-zinc ferromagnetic material, and a relative magnetic permeability of the nickel-zinc ferromagnetic material ranges from 100 to 400, a Curie temperature of the nickel-zinc ferromagnetic material ranges from 350° C. to 450° C., and an application frequency of the nickel-zinc ferromagnetic material is lower than 20 MHz.

6. The filter circuit according to claim 2, wherein a number of turns of the primary coil is greater than or equal to a number of turns of the secondary coil.

7. The filter circuit according to claim 2, wherein an inductance value of the inductor function member ranges from 40 μH to 100 μH.

8. The filter circuit according to claim 2, wherein numbers of turns of the inductive coils on the two second magnetic cores are equal, and inductance values of the inductive coils on the two second magnetic cores are equal.

9. The filter circuit according to claim 1, wherein the at least one of the at least two capacitor branches includes a ceramic capacitor.

10. A semiconductor processing apparatus, comprising:
    a chuck including a plurality of temperature zones, and configured to carry a workpiece to be processed; and
    a heating circuit configured to control temperatures of the plurality of temperature zones of the chuck, wherein the heating circuit includes:
    at least one load arranged in a one-to-one correspondence with the plurality of temperature zones of the chuck, wherein a number of the at least one load is equal to a number of temperature zones of the chuck;
    a heating source configured to provide electrical energy for heating the at least one load; and
    a filter circuit configured to filter the at least one load, wherein an input terminal of the filter circuit is connected to the heating source, and an output terminal of the filter circuit is connected to the at least one load, the filter circuit comprising:

an inductor branch including a one-piece structured integrated component configured with a transformer function member and an inductor function member; and at least two capacitor branches, wherein at least one of the at least two capacitor branches are in a shunt connection with the inductor function member in the inductor branch, wherein:

the inductor function member is connected in series between the heating source and the transformer function member and configured to filter the at least one load, and the transformer function member is connected in parallel with the at least one load and configured to transmit a heating electrical signal output by the heating source to the at least one load.

11. A heating circuit for heating a chuck that carries a workpiece to be processed and separately controlling temperatures of a plurality of temperature zones of the chuck, wherein the heating circuit comprises:

at least one load arranged in a one-to-one correspondence with the plurality of temperature zones of the chuck, wherein a number of the at least one load is equal to a number of temperature zones of the chuck;

a heating source configured to provide electrical energy for heating the at least one load; and a filter circuit configured to filter the at least one load, wherein an input terminal of the filter circuit is connected to the heating source, and an output terminal of the filter circuit is connected to the at least one load, the filter circuit comprising:

an inductor branch including a one-piece structured integrated component configured with a transformer function member and an inductor function member; and at least two capacitor branches, wherein at least one of the at least two capacitor branches are in a shunt connection with the inductor function member in the inductor branch, wherein:

the inductor function member is connected in series between the heating source and the transformer function member and configured to filter the at least one load, and the transformer function member is connected in parallel with the at least one load and configured to transmit a heating electrical signal output by the heating source to the at least one load.

12. The heating circuit according to claim 11, wherein:

the transformer function member includes a first magnetic core in a closed loop, the first magnetic core including a first side and a second side disposed opposite to each other, wherein a primary coil is wound on the first side, a secondary coil is wound on the second side; and two terminals of the secondary coil are respectively coupled to a positive terminal and a negative terminal of the load; and the inductor function member includes two second magnetic cores respectively connected to terminals of the first side and forming a non-closed open loop with the first side; and inductive coils are respectively wound on the two second magnetic cores, and one terminal of each of the inductive coils on the two second magnetic core is respectively connected to two terminals of the primary coil, and another terminal of each of the inductive coils on the two second magnetic cores is respectively connected to the positive and negative terminals of the heating source.

13. The heating circuit according to claim 12, wherein:

each of the two second magnetic cores is of a columnar shape;

the two second magnetic cores are parallel to each other; and one terminal of each of the two second magnetic cores is respectively connected to the terminals of the first side.

14. The heating circuit according to claim 12, wherein:

the first magnetic core and the second magnetic core are fabricated using a ferromagnetic material; and an application frequency of the ferromagnetic material ranges from 400 KHz-100 MHz.

15. The heating circuit according to claim 14, wherein:

the ferromagnetic material includes a nickel-zinc ferromagnetic material, and a relative magnetic permeability of the nickel-zinc ferromagnetic material ranges from 100 to 400, a Curie temperature of the nickel-iron ferromagnetic material ranges from 350° C. to 450° C., and an application frequency of the nickel-zinc ferromagnetic material is lower than 20 MHz.

16. The heating circuit according to claim 12, wherein a number of turns of the primary coil is greater than or equal to a number of turns of the secondary coil.

17. The heating circuit according to claim 12, wherein an inductance value of the inductor function member ranges from 40 µH to 100 µH.

18. The heating circuit according to claim 12, wherein numbers of turns of the inductive coils on the two second magnetic cores are equal, and inductance values of the inductive coils on the two second magnetic cores are equal.

* * * * *